United States Patent
Su et al.

(10) Patent No.: US 12,363,893 B2
(45) Date of Patent: Jul. 15, 2025

(54) SEMICONDUCTOR MEMORY STRUCTURE

(71) Applicant: Taiwan Semiconductor Manufacturing Company, Ltd.

(72) Inventors: Hsin-Wen Su, Hsinchu (TW); Shih-Hao Lin, Hsinchu (TW); Yu-Kuan Lin, Taipei (TW); Lien-Jung Hung, Taipei (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 176 days.

(21) Appl. No.: 18/357,838

(22) Filed: Jul. 24, 2023

(65) Prior Publication Data

US 2023/0371248 A1    Nov. 16, 2023

Related U.S. Application Data

(62) Division of application No. 17/320,049, filed on May 13, 2021, now Pat. No. 11,792,977.

(51) Int. Cl.
*H10B 20/25* (2023.01)

(52) U.S. Cl.
CPC .................. *H10B 20/25* (2023.02)

(58) Field of Classification Search
CPC .......... H10B 20/25; G11C 17/18; G11C 17/16
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,305,922 B2 * | 4/2016 | Kim | H10D 64/661 |
| 9,520,482 B1 | 12/2016 | Chang et al. | |
| 9,576,814 B2 | 2/2017 | Wu et al. | |
| 9,640,534 B2 * | 5/2017 | Kim | H10D 84/013 |
| 10,276,253 B2 | 4/2019 | Miyatake | |
| 11,430,652 B2 * | 8/2022 | Lee | H01L 21/76841 |
| 2013/0005133 A1 * | 1/2013 | Lee | H10D 84/0142 257/E21.19 |
| 2019/0326284 A1 * | 10/2019 | Kim | H10D 84/0181 |
| 2020/0058660 A1 | 2/2020 | Chang et al. | |

* cited by examiner

*Primary Examiner* — Allison Bernstein
(74) *Attorney, Agent, or Firm* — HAYNES AND BOONE, LLP

(57) ABSTRACT

A method includes receiving a workpiece. The workpiece includes a first dummy gate, a second dummy gate adjacent the first dummy gate, a first gate spacer disposed along sidewalls of the first dummy gate, and a second gate spacer disposed along sidewalls of the second dummy gate. The method further includes removing the first dummy gate and the second dummy gate to form a first gate trench and a second gate trench, respectively, enlarging the first gate trench and the second gate trench, forming a first metal gate structure in the enlarged first gate trench, and forming a second metal gate structure in the enlarged second gate trench. The enlarged second gate trench is wider than the enlarged first gate trench.

20 Claims, 13 Drawing Sheets

SEMICONDUCTOR MEMORY STRUCTURE

PRIORITY DATA

This application is a divisional application of U.S. patent application Ser. No. 17/320,049, filed May 13, 2021, the entirety of which is hereby incorporated herein by reference.

BACKGROUND

Among semiconductor memory devices, non-volatile memory (NVM) devices can be used to store data even if power to the memory device is turned off. In various examples, NVM devices may include read only memory (ROM), magnetic memory, optical memory, or flash memory, among other types of NVM devices. Different types of NVM devices may be programmed once, a few times, or many times. NVM devices that are programmed once, after which they cannot be rewritten, are referred to as one-time programmable (OTP) NVM devices. OTP NVM devices are often used for embedded NVM applications because of their compatibility to existing processes, scalability, reliability, and security. Depending on the target application, device requirements, or process requirements, OTP NVM devices may be implemented using floating gate, e-fuse, or antifuse technology.

Regardless of the technology used to implement an OTP NVM device, cell current ($I_{cell}$) plays an important role in NVM device operation. By way of example, degraded cell current may result in device failure (e.g., such as read failure). Further, it is known that a program word line (WLP) voltage is correlated to the cell current. In some examples, increased gate resistance may cause an undesirable parasitic voltage drop that results in a degraded WLP voltage for a given memory cell, which can result in degraded cell current and device failure.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
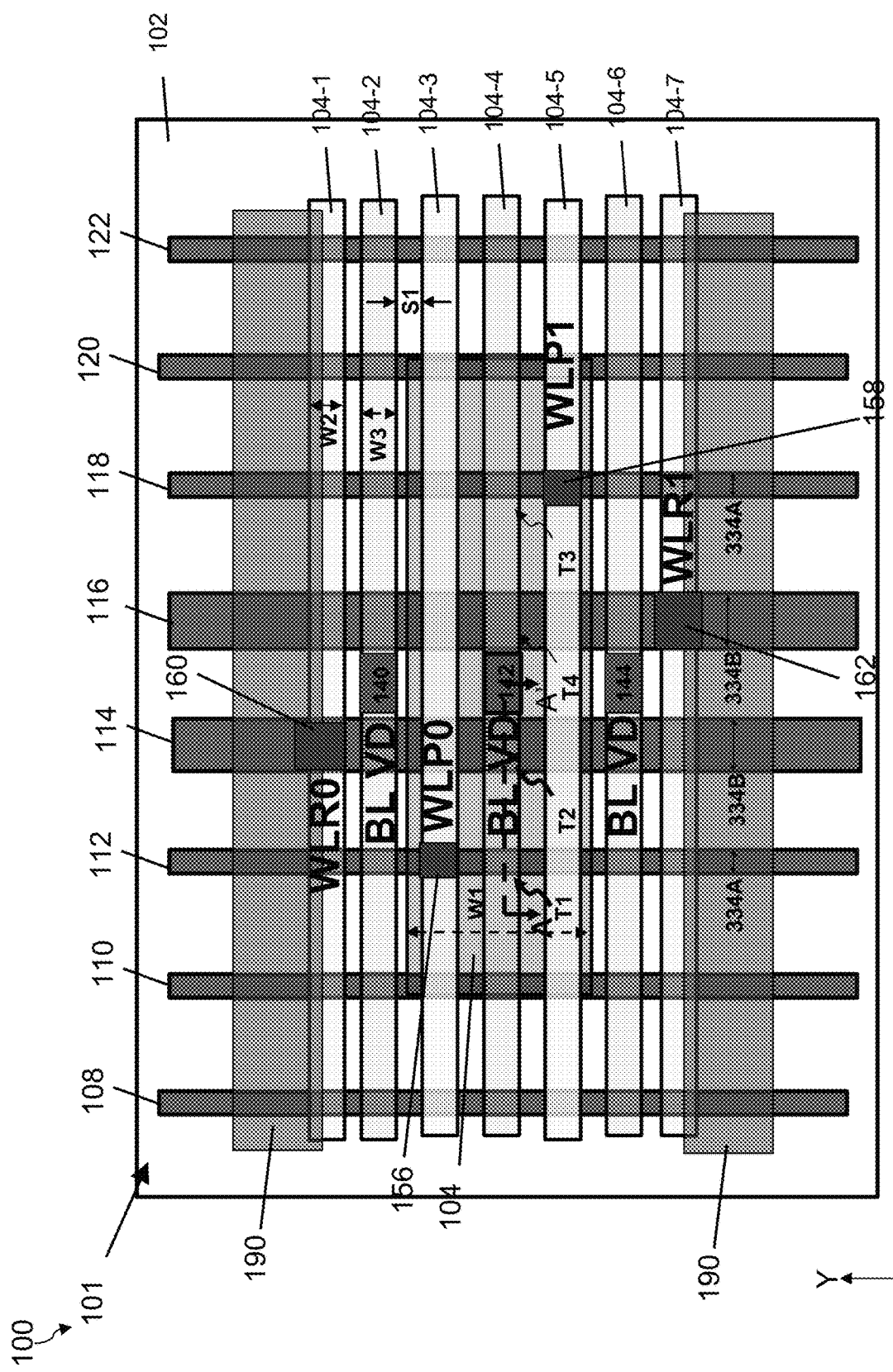
FIG. 1 is a layout view of a portion of the semiconductor memory structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Among semiconductor memory devices, non-volatile memory (NVM) devices can be used to store data even if power to the memory device is turned off. NVM devices may include read only memory (ROM), magnetic memory, optical memory, or flash memory, where various types of NVM devices may be programmed once, a few times, or many times. NVM devices that are programmed once, after which they cannot be rewritten, are referred to as one-time programmable (OTP) NVM devices. OTP NVM devices are often used for embedded NVM applications because of their compatibility to existing processes, scalability, reliability, and security. Depending on the target application, device requirements, or process requirements, OTP NVM devices may be implemented using floating gate, e-fuse, or antifuse technology.

In various examples, electrical connections to individual NVM devices may be formed during a back-end-of-line (BEOL) fabrication process. In a BEOL process, a network of conductive metal interconnect layers (e.g., such as copper) is formed to connect various components of a semiconductor integrated circuit (IC). The network of conductive metal interconnect layers is formed within an interlayer dielectric (ILD) material that may include a low-K dielectric material. The ILD material electrically isolates adjacent metal interconnect layers from each other, both within a given interconnect level and between adjacent levels of interconnect layers. By way of example, damascene processes such as single damascene processes and dual-damascene processes are routinely used for fabricating multi-level interconnect structures. In a damascene process, trenches and via holes are formed inside and through an ILD layer, and filled with a conductive material (e.g., such as copper or a copper-based alloy), to create metallization lines and vertical conductive paths (vias) between adjacent interconnect layers.

FIG. 1 provides a layout view of a portion 101 of a semiconductor memory structure 100. In some embodiments, the portion 101 may be a memory cell of the semiconductor memory structure 100. In some embodiments, the semiconductor memory structure 100 may include an array of memory cells, each being similar or dissimilar from the portion 101. The portion 101 illustrates an active region 104, gate structures 108, 110, 112, 114, 116, 118, 120, 122 formed on the active region 104, and metal lines 104-1, 104-2, 104-3, 104-4, 104-5, 104-6, 104-7, as well as the program word line nodes (WLP0, WLP1) and the read word line nodes (WLR0, WLR1) associated with the active region 104. In the depicted embodiments, the metal lines 104-1, 104-2, 104-3, 104-4, 104-5, 104-6, 104-7 are formed within a same conductive/interconnect layer (e.g., such as within a metal-0 (M0) interconnect layer). FIG. 1 also illustrates cut metal regions 190. In some examples, the cut metal regions 190 include dielectric regions that are used to electrically isolate metal layers that contact source/drain regions of neighboring active regions.

In some embodiments, the portion 101 of the semiconductor memory structure is formed on a semiconductor substrate 102 that may include a silicon substrate, and may include various layers, including conductive or insulating layers formed on the silicon substrate. The semiconductor substrate 102 may include various doping configurations depending on design requirements as is known in the art. The semiconductor substrate 102 may also include other semiconductors such as germanium (Ge), silicon carbide (SiC), silicon germanium (SiGe), or diamond. Alternatively, the semiconductor substrate 102 may include a compound semiconductor and/or an alloy semiconductor. Further, in some embodiments, the semiconductor substrate 102 may include an epitaxial layer (epi-layer), the semiconductor substrate 102 may be strained for performance enhancement, the semiconductor substrate 102 may include a silicon-on-insulator (SOI) structure, and/or the semiconductor substrate 102 may have other suitable enhancement features.

In some cases, the active region 104 may include fin structures, used to form a fin field-effect transistor (FinFET). In some examples, the active region 104 may also include doped regions, such as doped semiconductor regions, within which transistor source/drain regions may be formed. In some cases, an ion implantation process may be used to introduce a dopant species into a semiconductor substrate 102 within the active region 104. In the depicted embodiments, the active region 104 has a width 'W1' configured to accommodate multiple metal lines, thereby to reduce bit line resistances. For example, in some embodiments, the width 'W1' is about 60 nm to about 150 nm. Alternatively, the active region 104 may be configured to accommodate only one metal line, thereby to reduce the complexity and fabrication costs. For example, in some embodiments, the width 'W1' is about 50 nm to about 70 nm.

In various examples, isolation regions such as shallow trench isolation (STI) regions may be formed on the semiconductor substrate 102 to isolate neighboring devices (e.g., transistors, NVM devices, etc.) from one another. Such isolation regions may be composed of silicon oxide, silicon nitride, silicon oxynitride, fluorine-doped silicate glass (FSG), a low-k dielectric, combinations thereof, and/or other suitable material known in the art. In an embodiment, the isolation regions are formed by etching trenches in the substrate. The trenches may then be filled with isolating material, followed by a chemical mechanical polishing (CMP) process. However, other embodiments are possible. In some embodiments, the isolation regions may include a multi-layer structure, for example, having one or more liner layers.

As shown, at least some of the gate structures are formed over the active region 104. By way of example, an array of transistors may be formed at intersections of the gate structures and the active region 104 (e.g., such as transistors T1, T2, T3, and T4, noted in FIG. 1), where the array of transistors may form an NVM memory array. The gate structures may function as word lines of the memory array. In some embodiments, the gate structures 108, 110, 112, 114, 116, 118, 120, 122 may include a gate dielectric and a gate electrode disposed on the gate dielectric. In some embodiments, the gate dielectric may include an interfacial layer such as silicon oxide layer ($SiO_2$) or silicon oxynitride (SiON). In some examples, the gate dielectric includes a high-K dielectric layer such as hafnium oxide ($HfO_2$). Alternatively, the high-K dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), other suitable material, or combinations thereof. In still other embodiments, the gate dielectric may include silicon dioxide or other suitable dielectric. In various embodiments, the gate electrode includes a conductive layer such as tungsten (W), titanium (Ti), titanium nitride (TiN), titanium aluminum (TiAl), titanium aluminum nitride (TiAlN), tantalum (Ta), tantalum nitride (TaN), tungsten nitride (WN), rhenium (Re), iridium (Ir), ruthenium (Ru), molybdenum (Mo), aluminum (Al), copper (Cu), cobalt (Co), cobalt silicide (CoSi), nickel (Ni), nickel silicide (NiSi), other suitable compositions, or combinations thereof. In some embodiments, the gate electrode may alternatively or additionally include a polysilicon layer. In some embodiments, sidewall spacers are formed on sidewalls of the gate structures. Such sidewall spacers may include a dielectric material such as silicon oxide, silicon nitride, silicon carbide, silicon oxynitride, or combinations thereof.

The portion 101 of the semiconductor memory structure further includes metal lines. In the depicted embodiments, the metal lines 104-1, 104-2, 104-3, 104-4, 104-5, 104-6, 104-7 are configured for the active region 104. Alternatively, more or fewer metal lines may be configured for the active region 104. In the depicted embodiments, the metal lines are formed within a same conductive/interconnect layer, such as the metal-0 (M0) interconnect layer. Alternatively, one or more of the metal lines may be formed in a different interconnect layer. The metal lines 104-1, 104-2, 104-3, 104-4, 104-5, 104-6, 104-7 may include copper, aluminum, or other appropriate metal or metal alloy.

As illustrated in FIG. 1, metal line 104-3 may be electrically connected to underlying gate structure 112 by a conductive via 156 to provide a first program word line (WLP0) node, and metal line 104-5 may be electrically connected to underlying gate structure 118 by a conductive via 158 to provide a second program word line (WLP1) node. Further, metal line 104-1 may be electrically connected to underlying gate structure 114 by a conductive via 160 to provide a first read word line (WLR0) node, and metal line 104-7 may be electrically connected to underlying gate structure 116 by a conductive via 162 to provide a second read word line (WLR1) node.

In some examples, metal line 104-2 may be electrically connected to underlying active region 104 (e.g., which may include an underlying source/drain region) by a conductive via 140, metal line 104-4 may be electrically connected to underlying active region 104 by a conductive via 142, and metal line 104-6 may be electrically connected to underlying active region 104 by a conductive via 144. Although FIG. 1 shows conductive vias 140 and 144 outside edges (or circumferences) of the active region 104, they may be electrically connected to the active region 104 by features omitted from FIG. 1 (such as local contact features). Thus, the metal lines 104-2, 104-4, 104-6 may function as bit lines of the memory device associated with the active region 104. Accordingly, the metal lines 104-2, 104-4, 104-6 may also be interchangeable referred to as the bit lines 104-2, 104-4, and 104-6.

In the depicted embodiments, the metal lines 104-1, 104-3, 104-5, 104-7 may have a width 'W2' along the Y-direction of about 10 nm to about 50 nm; and the bit lines 104-2, 104-4, 104-6 have a width 'W3' of about 10 nm to about 30 nm. Additionally, in some embodiments, a spacing 'S1' between the metal lines connected to the gate structures and adjacent bit lines (e.g., such as between the metal lines 104-2 and 104-3) is about 10 nm to about 30 nm. In other embodiments, the metal lines 104-1, 104-2, 104-3, 104-4, 104-5, 104-6, 104-7 may be configured for multiple active regions. Accordingly, the metal lines may have greater widths. For example, the metal lines 104-1, 104-3, 104-5, 104-7 may have a width of about 30 nm to 50 nm; the metal lines 104-2, 104-4, 104-6 may have a width of about 50 nm to about 70 nm. Moreover, an area of the conductive vias 140, 142, and 144 may be about 400 nm$^2$ to about 700 nm$^2$; and an area of the conductive vias 156, 158, 160, 162 is about 50 nm$^2$ to about 200 nm$^2$.

In some embodiments, the gate structures 112 and 118 may have a width 334A along the X-direction. The gate structures 114 and 116 may have a width 334B along the X-direction. In the depicted embodiments, the gate structures 112, 114, 116, and 118 each has uniform width along their respective lengthwise direction. Because the current flows directionally along the width dimension of the gate structures during transistor operation, the width dimension of the gate structures are also interchangeably referred to as the "gate length" dimension. Accordingly, widths 334A and 334B are interchangeably referred to as the gate lengths 334A and 334B, respectively. In some approaches, the gate structures may have the same width as each other. For example, the widths 334A and 334B are about the same as each other. However, because the gate structures may be subjected to different operation conditions and serve different functions, uniform widths may not provide the optimal functionalities. For example, in the depicted embodiments, gate structures 112 and 118 provide for the WLP0 and WLP1 nodes, while the gate structures 114 and 116 provide for the WLR0 and WLR1 nodes. A smaller width 334A is beneficial in that it leads to a smaller gate leakage current (Igi) and provides a larger read margin for the unprogrammed state ("0" state). More specifically, a smaller gate length 334A (for example, of gate structure 112) increases the separation from adjacent gate structures (such as gate structures 110 and 114). Accordingly, gate leakage current (Igi) between gate structure 112 and gate structure 110 and/or 114 is reduced. The read margin for the unprogrammed state of the memory cell (or the "0" state) is determined by the difference between the gate leakage current (Igi) and a reference current. Accordingly, the smaller gate leakage current results in a greater read margin. Conversely, a smaller gate length 334B may cause punch through in the channel layers below the gate structures that provide the WLR0 node and/or WLR1 nodes. For example, during operation, the drain feature of the T2 transistor is connected to the ground (e.g. having a 0V applied thereon); and the source feature of the T2 transistor (formed over the gate structure 114) is connected to a relatively high voltage. If the gate length is too short, in other words, the channel length is too short, the large voltage difference may cause punch through in the channel, thereby cause malfunctions. Accordingly, a larger gate length 334B is beneficial for improved device reliability. In other words, optimal device performance mandates different widths of the gate structures 112 and 118 versus those of the gate structures 114 and 116. Therefore, the present disclosure provides methods to form such gate structures having different gate lengths 334A and 334B.

Figure 2A:
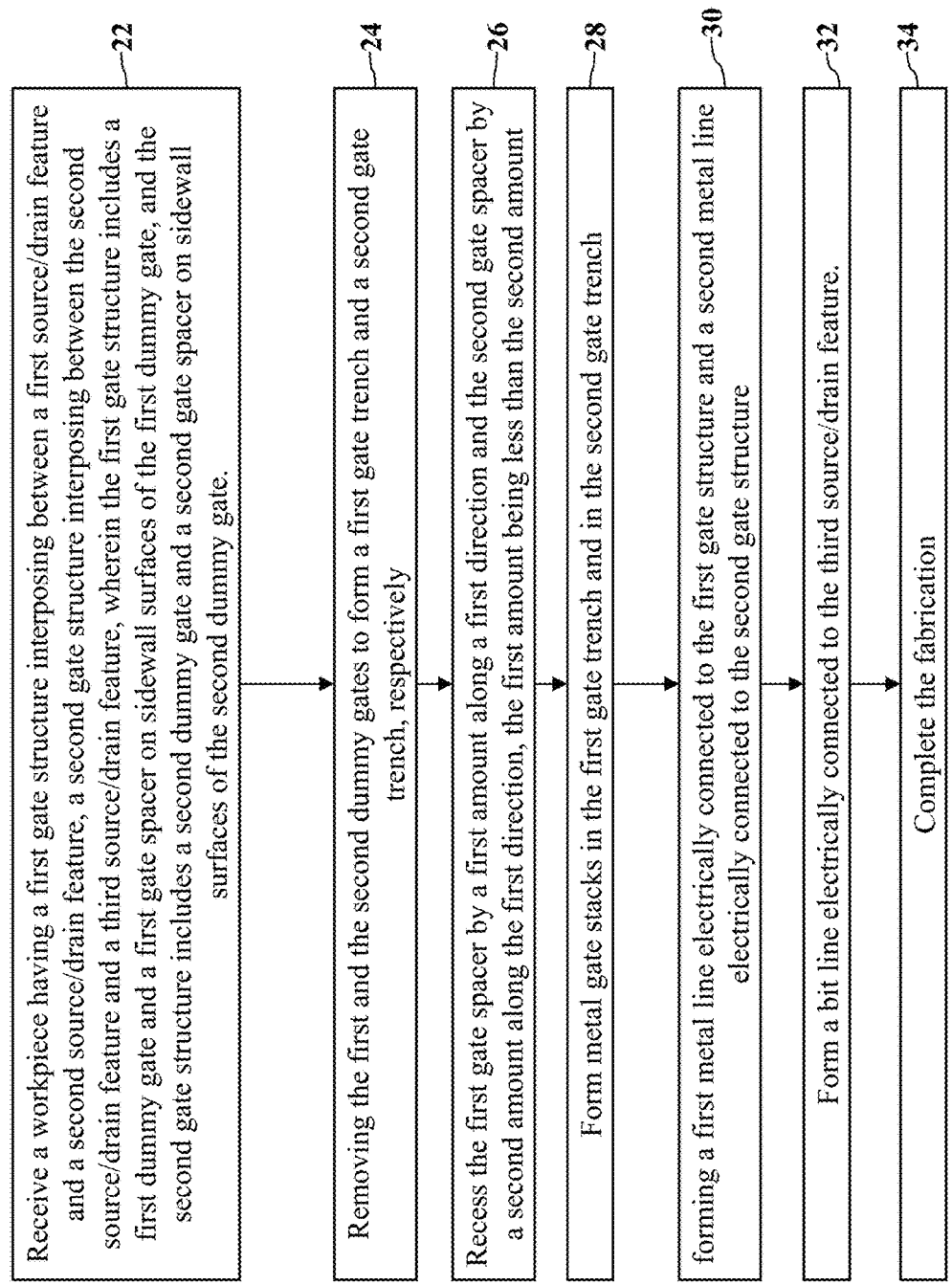
FIGS. 2A, 2B are flow charts of a method for fabricating a semiconductor memory structure according to various aspects of the present disclosure.
Figure 2B:
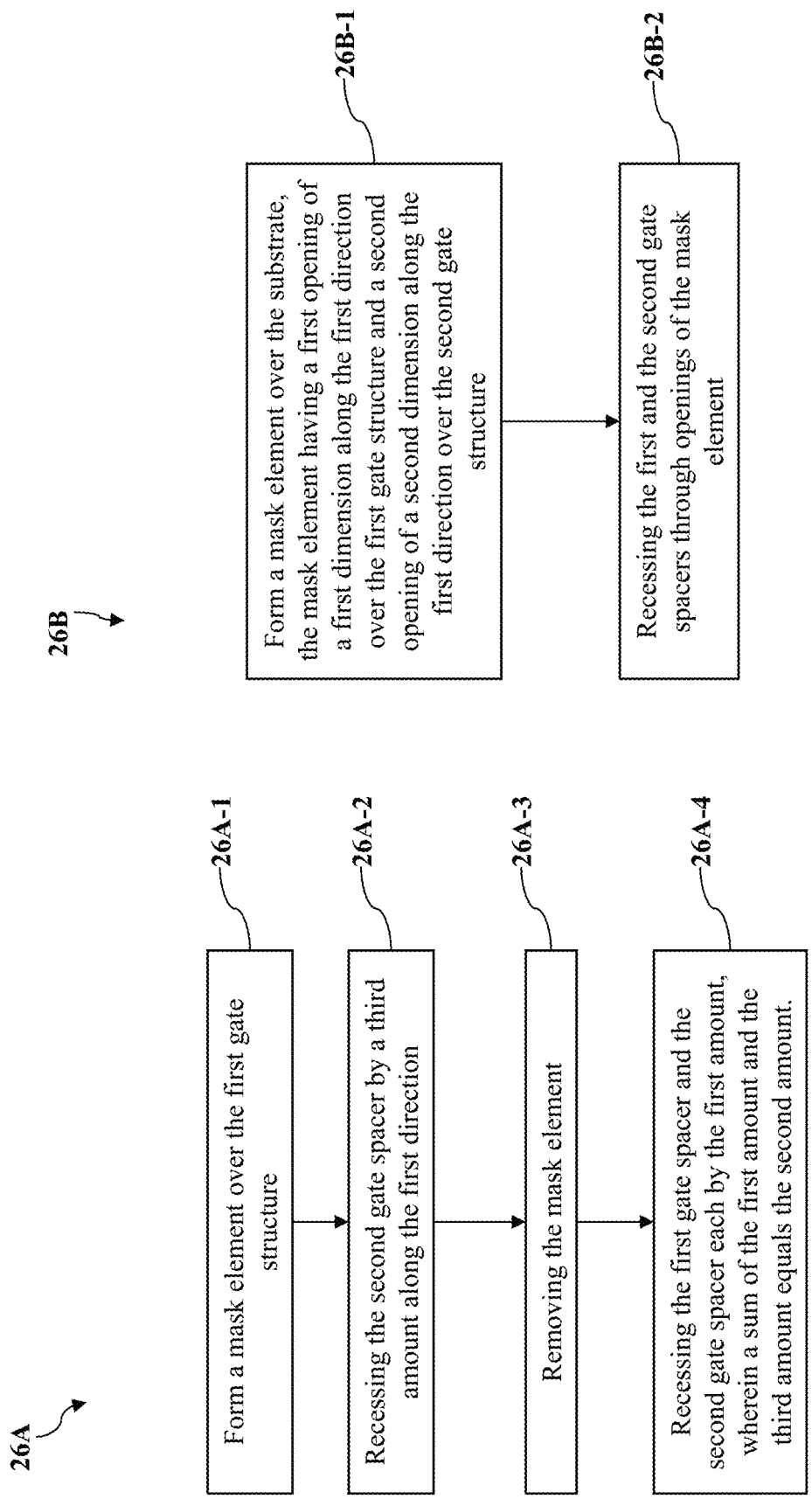

FIGS. 2A and 2B are a flow chart of a method 20 for fabricating a portion 201 of a semiconductor memory structure according to various aspects of the present disclosure. FIGS. 3-10 are diagrammatic cross-sectional views of the portion 201 of the semiconductor memory structure, along the A-A' plane of FIG. 1, at different fabrication stages, according to embodiments of the present disclosure.

Figure 3:
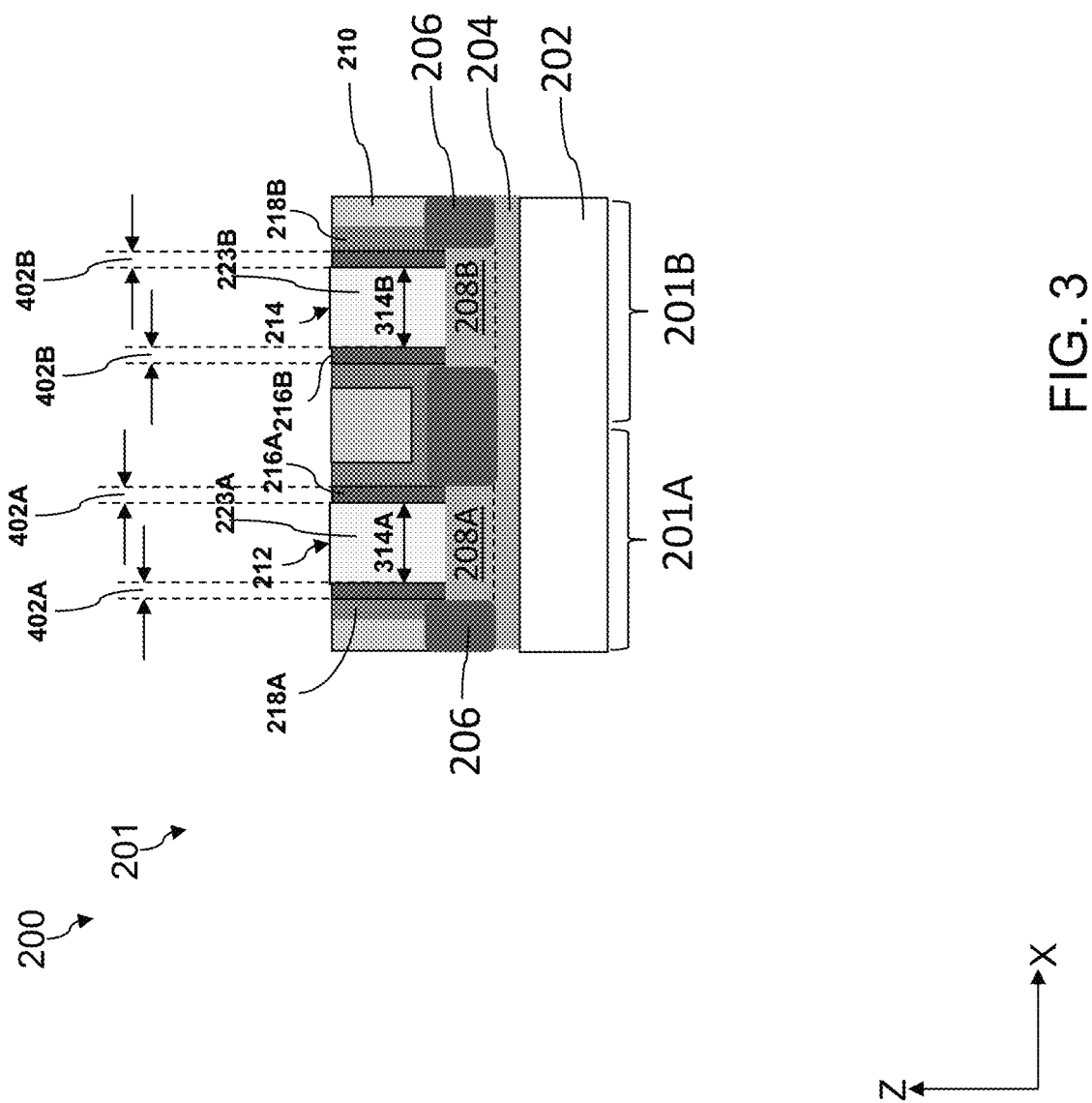
FIGS. 3, 4, 5, 6, 7, 8, 9, 10, and 11 are diagrammatic cross-sectional views of a portion of the semiconductor memory structure of the present disclosure, at various processing stages, according to various aspects of the present disclosure.

Referring to block 22 of FIG. 2A and to FIG. 3, a semiconductor workpiece 200 is received. The semiconductor workpiece 200 includes a portion 201 and a substrate 202. An active region 204 is formed on the substrate 202. The substrate 202 and the active region 204 may each resemble the substrate 102 and active region 104 described above with respect to FIG. 1, respectively. For example, the active region 204 may be a fin active region and include a fin structure. The semiconductor workpiece 200 also includes gate structures 212 and 214 formed on the active region 204, such as along a direction perpendicular to a lengthwise direction of the active region 204. In the depicted embodiments, the active region 204 extends lengthwise along the X-direction (similar to the active region 104 of FIG. 1), and the gate structures 212 extend lengthwise along the Y-direction (similar to the gate structures 112 of FIG. 1). The gate structure 212 later provides for a WLP0 node, and the gate structure 214 later provides for a WLR0 node. Accordingly, the device region in which the gate structure 212 is located is referred to as a WLP region 201A; and the device region in which the gate structure 214 is located is referred to as a WLR region 201B. The gate structure 212 includes a gate stack 223A and gate spacers 216A on both sides of the gate stack 223A, and the gate structure 214 includes a gate stack 223B and gate spacers 216B on both sides of the gate stack 223B. In the depicted embodiments, the gate structures 212 further includes gate spacers 218A on both sides of the gate spacers 216A; and the gate structures 214 further includes gate spacers 218B on both sides of the gate spacers 216B. Alternatively, the gate spacers 218A and 218B may be omitted.

The gate stacks 223A and 223B each includes a dummy material, such as polysilicon. As described later, gate stacks 223A and 223B may be later replaced with a metal gate stack. The gate stacks 223A has a width dimension 314A along the X-direction, for example, between the two sidewall surfaces of the opposing gate spacers 216A. The gate stacks 223B has a width dimension 314B along the X-direction, for example, between the two sidewall surfaces of the opposing gate spacers 216B. In some embodiments, the width dimensions 314A and 314B are substantially the same. For example, having the same width dimensions simplifies the design and fabrication of the device. The gate spacers 216A and 216B may include a same or different material. In the depicted embodiments, the gate spacers 216A and 216B include a same material. For example, the gate spacers 216A and 216B may include silicon oxide, other suitable materials, or combinations thereof. Similarly, the gate spacers 218A and 218B may include a same or different material. In the depicted embodiments, the gate spacers 218A and 218B include a same material. For example, the gate spacers 218A and 218B may include silicon nitride, silicon carbonitride, other suitable materials, or combinations thereof. In some embodiments, the materials, or material compositions of the gate spacers 218A and 218B may differ from that of the gate spacers 216A and 216B. This results in etching selectivity and may be beneficial for maintaining device integrity during certain subsequent fabrication processes. Moreover, the gate spacers 216A has a width 402A along the X-direction, and the gate spacers 216B has a width 402B along the X-direction. In the depicted embodiments, the widths 402A and width 402B may be substantially the same. This simplifies the fabrication of the gate spacers 216A and 216B and may have a cost benefit. Alternatively, in some embodiments, the widths 402A and 402B may be different from each other. For example, the width 402A may be configured to be greater than the width 402B. This may be beneficial for the controlling of the relative width dimensions of the subsequently formed metal gate stacks, as described in detail later.

The gate structures 212 and 214 each define a transistor channel 208A and 208B, respectively, in the active region 204. The portion 201 further includes epitaxial features 206 formed on both sides of the transistor channels 208A and 208B. In the depicted embodiments, one of the epitaxial features 206 ("common epitaxial feature") is formed between the transistor channel 208A and the transistor channel 208B, and is shared by two subsequently formed transistors (for example, T1 and T2). In some embodiments, the epitaxial features 206 may include silicon (Si) or silicon germanium (SiGe). Moreover, the epitaxial features 206 may be doped with phosphorous (P) dopant, thereby forming Si:P or SiGe:P epitaxial features. Additionally, the portion 201 includes interlayer dielectric (ILD) layer 210. In some embodiments, the ILD layer 210 includes silicon dioxide. In some embodiments, the ILD layer 210 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials.

Figure 4:
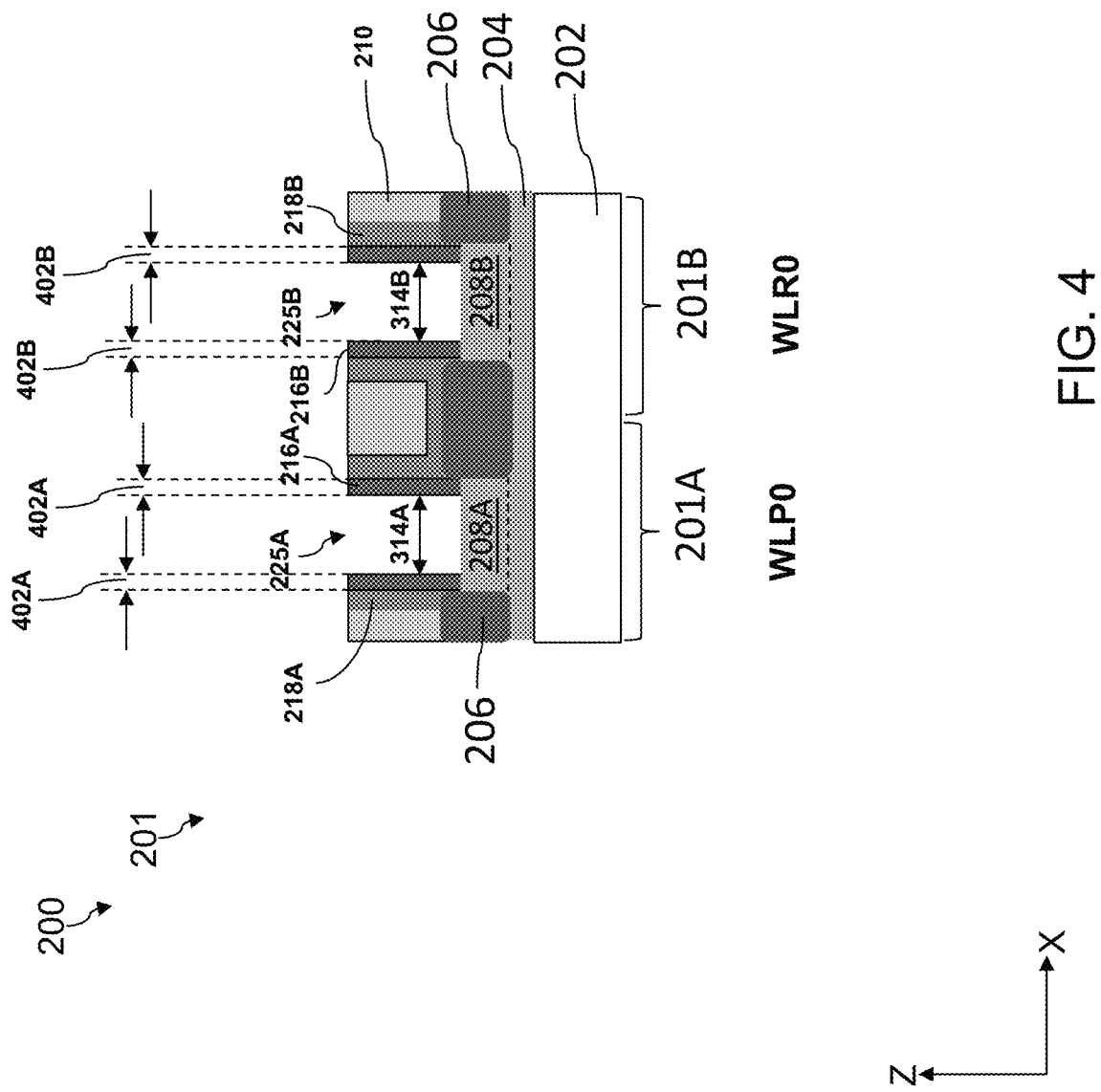

Referring to block 24 of FIG. 2A and to FIG. 4, the gate stacks 223A and 223B are removed in an etching operation, thereby forming gate trenches 225A and 225B, respectively. In some embodiments, the etching process are configured to achieve a selectivity between the materials of the gate stacks (e.g. polysilicon) and the gate spacers (e.g. silicon dioxide), such that the gate spacers 216A and 216B are used as the etching stop mechanism. Accordingly, the gate trenches 225A and 225B each maintain the width dimensions 314A and 314B, respectively. As described above, in the depicted embodiments, the width dimensions 314A and 314B are substantially the same from each other. Moreover, the gate spacers 216A and 216B each substantially maintain their respect widths 402A and 402B, respectively.

Referring to block 26 of FIG. 2A, the method 20 proceeds to recess the gate spacers 216A and 216B by a different amount. As described earlier, in the depicted embodiments, the gate trenches 225A and 225B have substantially the same widths 314A and 314B, respectively. The different recessing amounts of the gate spacers 216A and 216B enlarge the respective gate trenches 225A and 225B by a different amount, such that the enlarged gate trenches are of different widths. Accordingly, subsequently formed gate stacks therein have different widths. FIG. 2B illustrate two ways to achieve this result, referred to as methods 26A and 26B, respectively.

Figure 5:
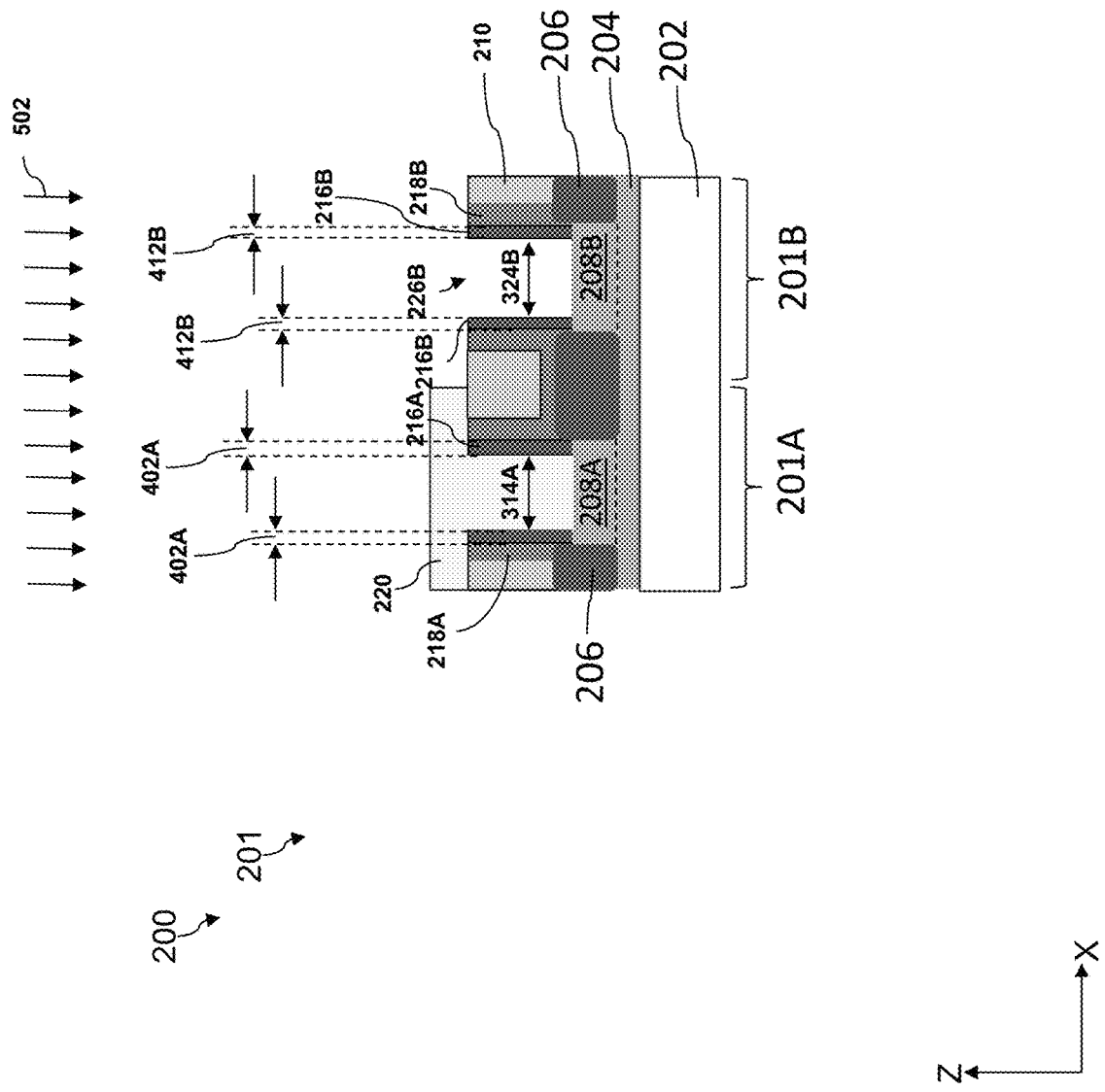

Referring to block 26A-1 of FIG. 2B and to FIG. 5, a mask element 220 is formed over the WLP region 201A. The mask element 220 fills the gate trench 225A, covers the top surfaces of the gate spacers 216A, 218A, and covers adjacent portions of the ILD layer 210. Meanwhile, the mask element 220 leaves the WLR region 201B exposed to subsequent processing. The mask element 220 may be any suitable mask element and can be formed using any suitable method. For example, the mask element may be a photoresist.

Referring to block 26A-2 of FIG. 2B and still to FIG. 5, an etching operation 502 is performed on the portion 201 that recesses the gate spacers 216B exposed in the WLR region 201B. For example, prior to the etching operation 502, the gate trench 225B has a width dimension 314B (see FIG. 4). After the etching operation 502, the gate trench is enlarged and becomes the enlarged gate trench 226B having a width dimension 324B. The width dimension 324B is greater than the width dimension 314B. Meanwhile, the width of the gate spacers 216B is reduced from width 402B before the etching operation to width 412B after the etching operation 502. The width 412B is less than the width 402B, and the difference between the width 412B and the width 402B is designated as $\Delta_1$. Meanwhile, because the WLP region 201A is covered and protected by the mask element 220, the gate spacers 216A are unaffected. In some embodiments, the difference $\Delta_1$ is about 0.25 nm to about 1.5 nm. Accordingly, a difference between the width 314B and 324B is twice $\Delta_1$, and is about 0.5 nm to about 3.0 nm. As described later, the difference $\Delta_1$ determines the width difference between the subsequently formed gate structures. If the $\Delta_1$ is too small, such as less than 0.25 nm, the benefit resulting from such difference may be too small to justify the additional processing cost. Conversely, if the $\Delta_1$ is too large, such as greater than 1.5 nm, the advanced technology nodes may not have sufficient physical size to accommodate such size difference without compromising other device features. In some embodiments, the number of etching cycles and time duration for each of the etching cycles are tuned to adjust the amount of etching of the gate spacers 216B. Referring to block 26A-3 of FIG. 2B, after the etching operation 502 is completed, the mask element 220 is removed using any suitable method. Accordingly, both WLP region 201A and the WLR region 201B are exposed.

Figure 6:
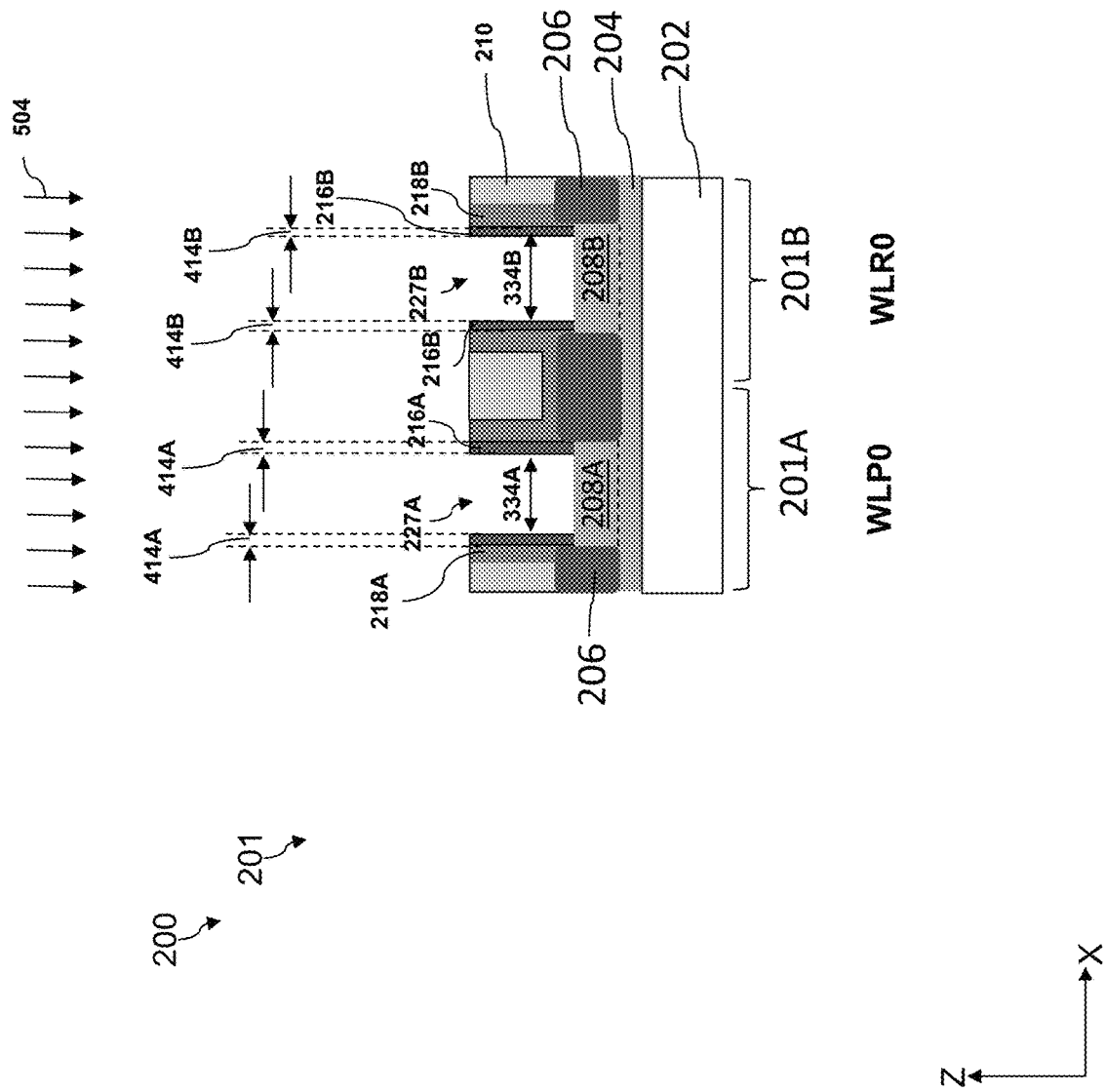

Referring to block 26A-4 of FIG. 2B and to FIG. 6, another etching operation 504 is performed on the portion 201 that recesses both the gate spacers 216A and the gate spacers 216B. As described above, in the depicted embodiments, the gate spacers 216A and 216B include substantially the same material. Accordingly, the etching operation 504 affects the gate spacers 216A and 216B to substantially the same extent. For example, substantially the same amount of dielectric material is removed from the gate spacers 216A and from the gate spacers 216B. In the depicted embodiments, after the etching operation 504, the gate spacers 216A has width 414A, and the gate spacers 216B has width 414B. In some embodiments, the width 414A is about 1 nm to about 10 nm; and the width 414B is about 1 nm to about 10 nm. A difference $\Delta_2$ between the width 414A and 402A may be substantially the same as the difference $\Delta_3$ between the width 414B and 412B. In some embodiments, a ratio of the $\Delta_1$ to the $\Delta_3$ (or $\Delta_2$) may be about 2:1 to about 4:1. If this ratio is too small, such as less than 2:1, there may be insufficient difference between the width of the gate structures 212 and 214. Accordingly, the benefits described above with respect to the differentiated gate lengths may not be effectively achieved.

Accordingly, the difference $\Delta_4$ between the width 414B and 402B is greater than the difference $\Delta_2$ between the width 414A and 402A. As illustrated in FIG. 6, the gate trench 225A is enlarged into the enlarged gate trench 227A, having a width 334A; and the gate trench 226B is further enlarged into the enlarged gate trench 227B, having a width 334B. The width 334B is greater than the width 334A. For example, a difference between the widths 334B and 334A is twice the difference $\Delta_1$. In other words, a difference between the widths 334B and 334A is about 0.5 nm to about 3 nm. In some embodiments, the width 334A may be about 5 nm to about 30 nm; and the width 334B may be about 5.5 nm to about 33 nm. If the width 334A and/or the width 334B is too small, resistances may increase which causes unacceptable drops of voltage across the length of the lines; if the width 334A and/or the width 334B is too large, the downscaling effort may be unnecessarily impeded. Similar to the etching operation 502, the number of etching cycles and time duration for each of the etching cycles are tuned to adjust the amount of etching of the gate spacers 216A and 216B during the etching operation 504.

Although the disclosure above describes performing the etching operation 502 prior to the etching operation 504, in some embodiments, it may instead be performed following the etching operation 504. In such embodiments, gate spacers 216A and 216B are both recessed by a same amount in the etching operation 504. Subsequently, the gate spacers 216B are subject additional recessing which does not affect the gate spacers 216A.

As described above, alternatively, method 26B may be used to form gate trenches of different widths. The method 26B proceeds from the processing stage associated with the block 24 of FIG. 2A and FIG. 4. Referring to block 26B-1 of FIG. 2B and to FIG. 7, a patterned mask element 230 is formed on the portion 201. The patterned mask element 230 has openings of different sizes in different regions. For example, the patterned mask element may have an opening with a width 334A' along the X-direction in the WLP region 201A, and may further have an opening with a width 334B' along the X-direction in the WLR region 201B. The widths 334A' and 334B' determine the width dimensions of the subsequently formed gate structures (such as width dimensions 334A and 334B described later). The width 334A' is greater than the width dimension 314A; and the width 334B' is greater than the width dimension 314B. In the depicted embodiments, the opening of the patterned mask element 230 is configured to be located symmetrically on the gate spacers. In other words, the distance (along the X-direction) between the exposed sidewall of a gate spacer 216A and the sidewall of the patterned mask element 230 immediately above it is substantially the same as the corresponding distance between the exposed sidewall of the opposing gate spacer 216A and the sidewall of the patterned mask element 230 immediately above it. In some embodiment, this distance corresponds to the difference $\Delta_2$'. Similarly, the distance along the X-direction between the sidewall of a gate spacer 216B and the sidewall of the patterned mask element 230 immediately above it is substantially the same as the corresponding distance between the sidewall of the opposing gate spacer 216B and the sidewall of the patterned mask element 230 immediately above it. In some embodiment, this distance corresponds to the difference $\Delta_4$'. In some embodiments, the mask element 230 is designed to result in a difference $\Delta_4$' from the difference $\Delta_2$'. For example, the difference $\Delta_4$' is greater than the difference $\Delta_2$' by about 0.25 nm to about 1.5 nm (referred to as the ΔΔ). If the ΔΔ is too small, such as less than 0.25 nm, the benefit resulting from such difference may be too small to justify the additional processing cost. Conversely, if the ΔΔ is too large, such as greater than 1.5 nm, the advanced technology nodes may not have sufficient physical size to accommodate such size difference without compromising other device features. Alternatively, the openings of the patterned mask element 230 is configured to be located asymmetrically on the gate spacers. In such embodiments, the difference $\Delta_2$' and difference $\Delta_4$' refers to the average of the two distances between the exposed sidewall of a gate spacer 216A and the respective sidewall of the patterned mask element 230 immediately above it.

Figure 7:
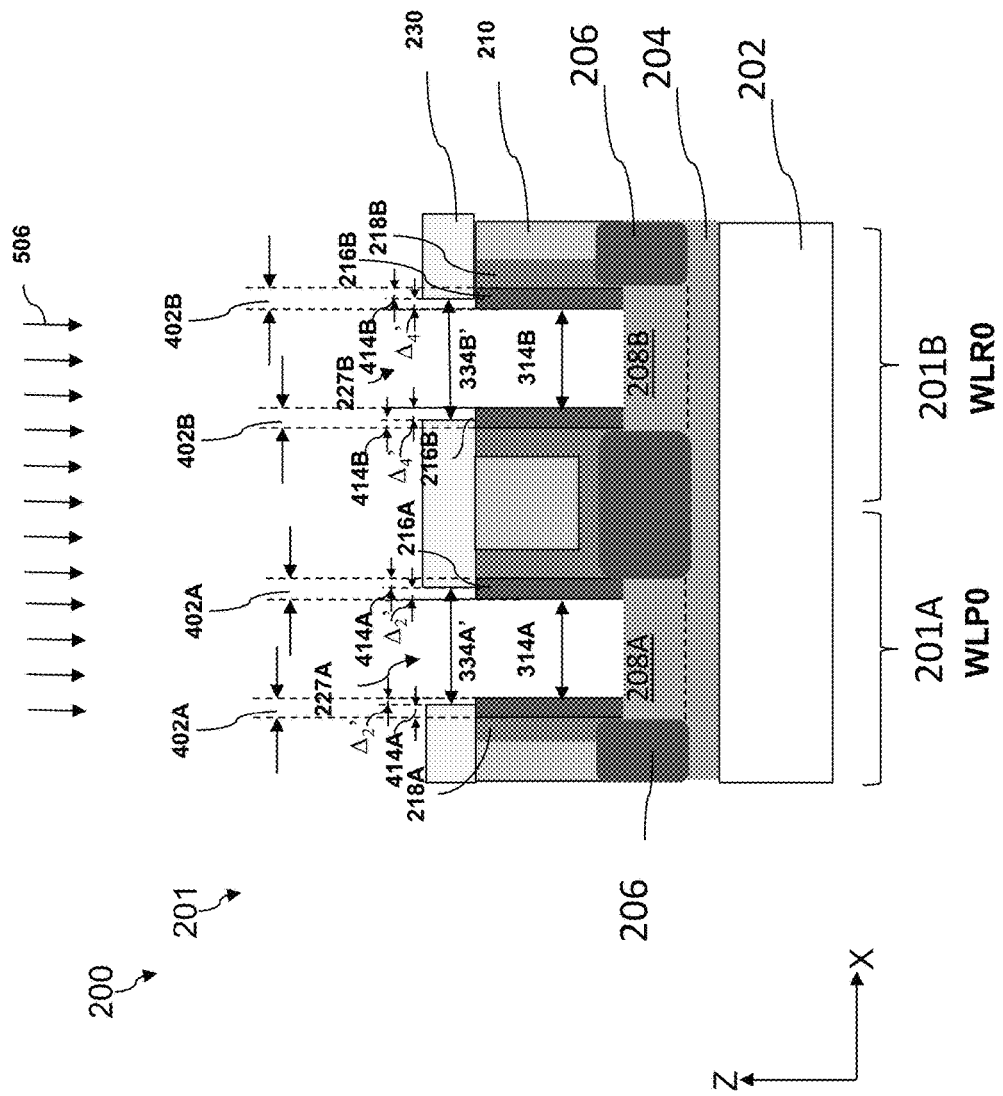

Referring to block 26B-2 of FIG. 2B and still to FIG. 7, an etching operation 506 is conducted on the portion 201 through the openings of the patterned mask element 230, such that portions of the gate spacers 216A and 216B are removed. The etching operation 506 enlarges the gate trenches 225A and 225B to enlarged gate trenches 227A and 227B respectively. The enlarged gate trenches 227A and 227B may each have a width dimension 334A and 334B, respectively. In some embodiments, the width dimensions 334A and 334B are determined by the widths of the openings of the patterned mask element 230. As a result, the width dimension 334A may be less than the width dimension 334B. For example, a difference between the width dimension 334A and the width dimension 334B may be twice the ΔΔ, in other words, about 0.5 nm to about 3 nm.

Figure 8:
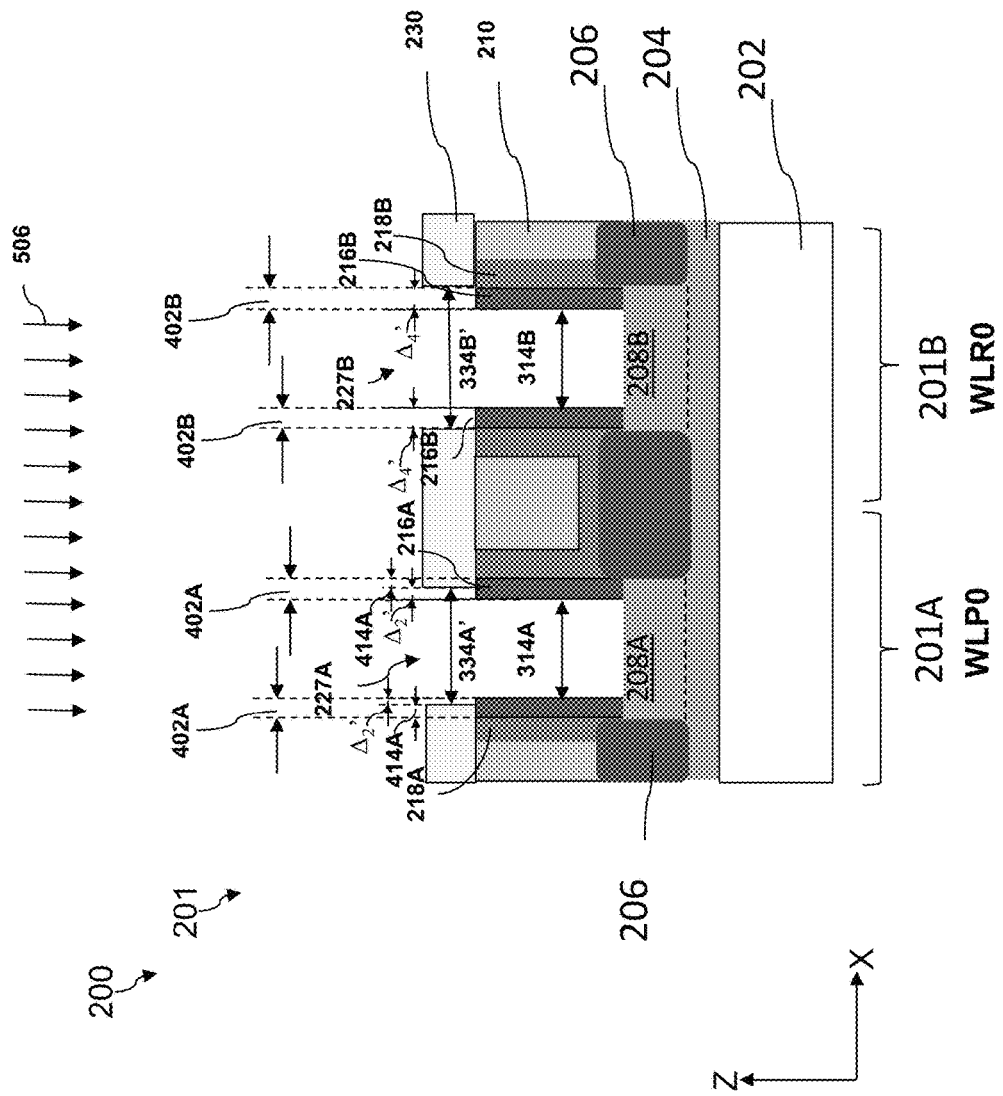
Figure 9:
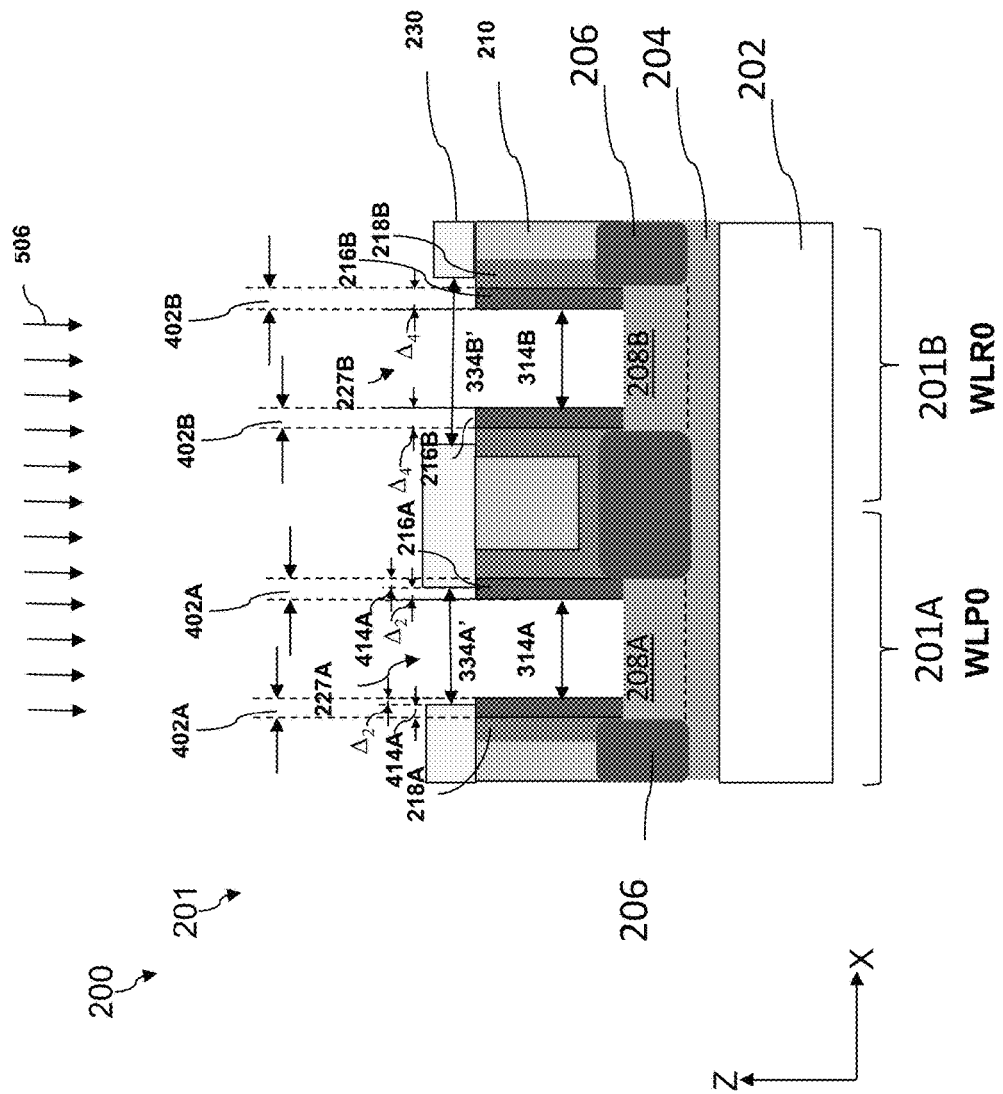
Figure 10:
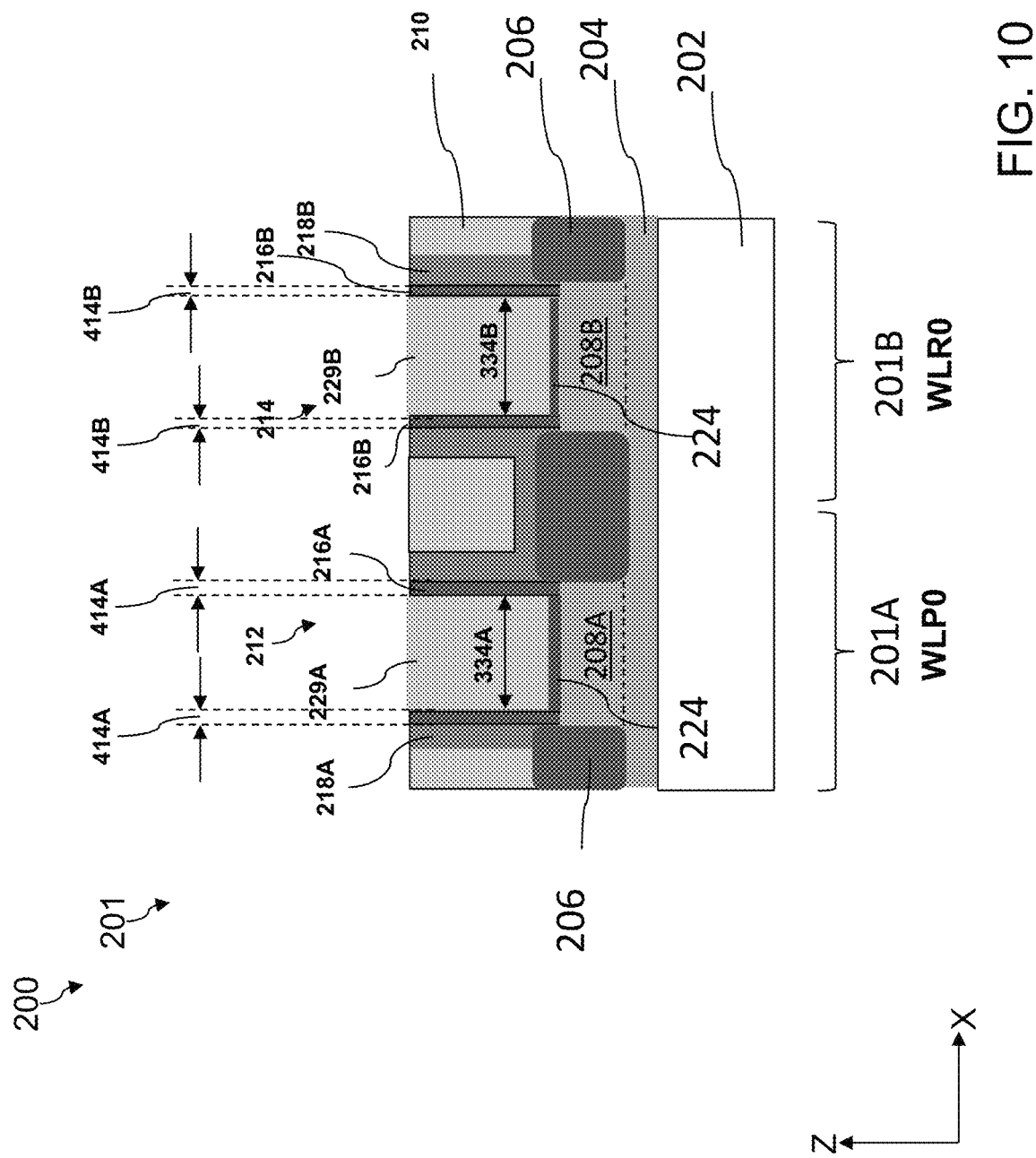

In some embodiments, referring to FIG. 8, the mask element 230 may be configured such that the edges of the opening in the WLR region 201B align with the interface of the gate spacers 216B and 218B. Accordingly, the width dimension 402B equals to $\Delta_4$', and the gate spacers 216B are completely removed during the etching operation 506. This provides a gate trench 227B that has sidewalls defined by sidewalls of the gate spacers 218B. In such embodiments, the sizes of the openings of the mask element 230 still dictates the widths of both the enlarged gate trenches 227A and 227B.

In some embodiments, while the width of the enlarged gate trench 227A is defined by the opening of the mask element 230, that of the enlarged gate trench 227B is instead defined by the gate spacers 218B. As described above, the gate spacers 216A, 216B may have different materials than the gate spacers 218A, 218B. Accordingly, an etching selectivity may be achieved by properly choosing the etching condition such that the etching rate of the gate spacers 216A, 216B is substantially greater (such as at least ten times greater) than the etching rate of the gate spacers 218A, 218B. For example, gate spacers 216A, 216B may include silicon oxide, while the gate spacers 218A, 218B may have silicon nitride. In some embodiments, this etching selectivity may be used to control the size of the enlarged gate trench 227B. For example, referring to FIG. 9, the mask element 230 may be configured to have opening sidewalls landing on the top surface of the gate spacers 216A in the WLP region 201A, while landing on the top surface of the gate spacers 218B in the WLR region 201B. Accordingly, the etching operation 506 in the WLP region 201A is confined by the openings of the mask element 230; while that in the WLR region 201B is confined not only be the openings of the mask element 230, but also by the gate spacers 218B based on its smaller etching rate (or etching resistance) towards the etching operation 506. As a result, the etching operation in the WLR region 201B may be configured to stop at an interface between the gate spacers 216B and 218B, before reaching the limitation imposed by the opening of the mask element 230. In other words, the etching operation terminates when the sidewall surfaces of the gate spacer 218B are exposed. Therefore, while the opening size of the mask element 230 dictates the width of the enlarged gate trench 227A in the WLP region 201A, the width of the enlarged gate trench 227B is instead dictated by the distance between the opposing sidewalls of the gate spacers 218B. In other words, the etching operation 506 may be configured to use the mask element 230 as the etching mask in the WLP region 201A, and to use the gate spacer 218B as the etching mask in the WLR region 201B.

After the desired widths of the enlarged gate trenches 227A and 227B are reached, the method 20 proceeds to form the replacement metal gate stacks 229A and 229B in the enlarged gate trenches 227A and 227B, respectively. Referring to block 28 of FIG. 2A, and FIG. 10, a gate dielectric layer 224 is formed in the enlarged gate trenches 227A, 227B and on the transistor channels 208A, 208B, respectively. The gate dielectric layer 224 includes any suitable dielectric materials, such as a high-k dielectric material. For example, the gate dielectric layer 224 may include hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, other suitable material, or combinations thereof. The gate dielectric layer 224 may be formed by ALD and/or other suitable methods. In some embodiments, an interfacial layer is formed to interpose between the gate dielectric layer 224 and the transistor channels 208A and/or 208B. Moreover, gate electrodes may be formed in the gate trenches and on the gate dielectric layer 224. The gate electrode may include tungsten (W), titanium nitride (TiN), tantalum nitride (TaN), tungsten nitride (WN), rhenium (Re), iridium (Ir), ruthenium (Ru), molybdenum (Mo), aluminum (Al), copper (Cu), cobalt (Co), nickel (Ni), other suitable conductive materials, or combinations thereof. The replacement metal gate stack 229A has the width dimension 334A, and the gate stack 229B has the width dimension 334B. A difference between the width dimensions 334A and 334B is about 0.5 nm to about 3 nm.

Figure 11:
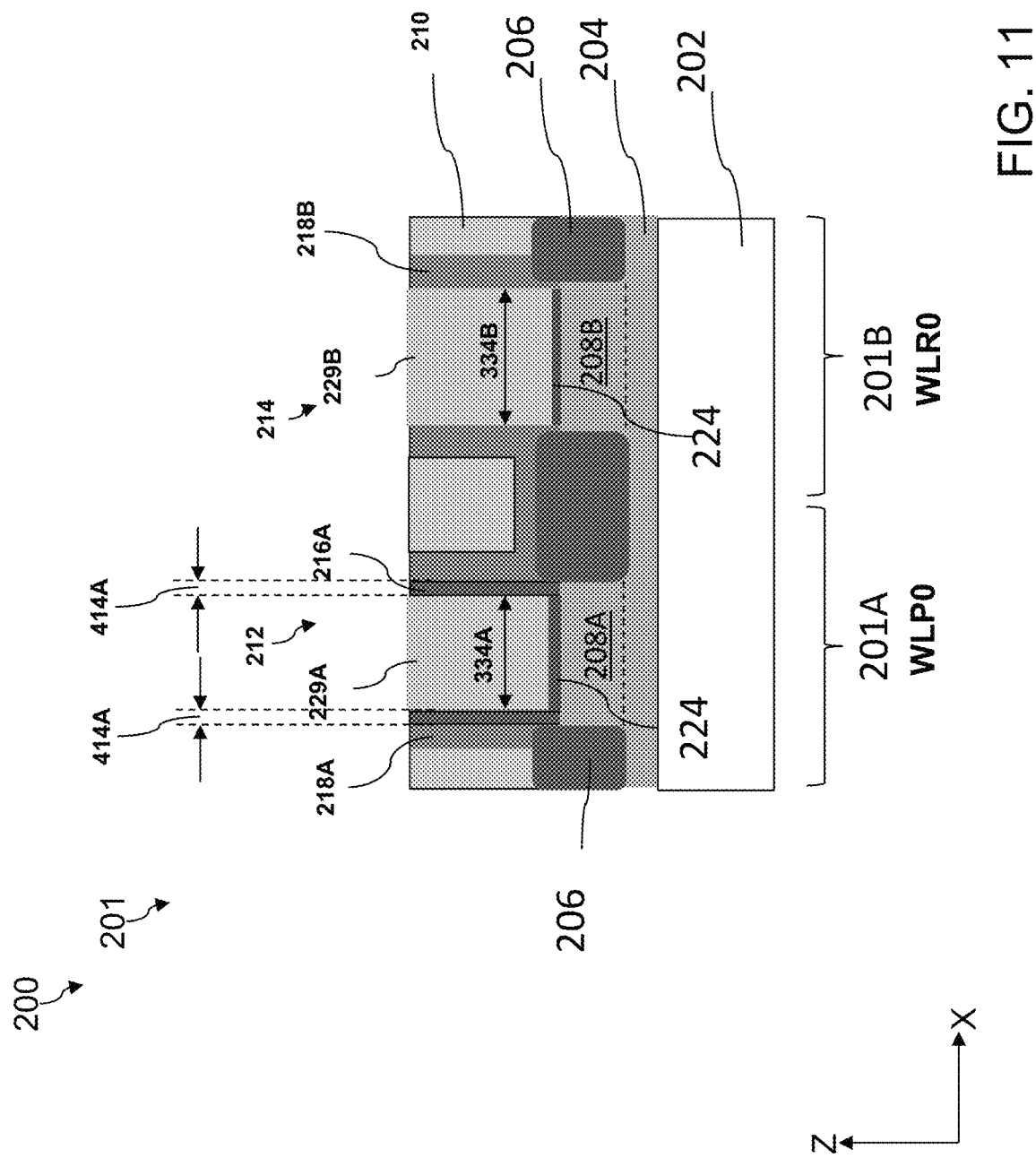

As the disclosure above provides, in some embodiments, the gate spacers 218A, 218B may define the sidewalls of the enlarged gate trenches 227B. In other words, the gate spacers 216B may be removed entirely. Accordingly, referring to FIG. 11, the gate stack 229B may directly interface with the gate spacer 218B, while the gate stack 229A directly interfaces with the gate spacer 216A.

Accordingly, the gate structure 212 has a width dimension 334A along the X-direction; and the gate structure 214 has a width dimension 334B along the X-direction. The width dimension 334A is less than the width dimension 334B. As described above, the smaller width dimension 334A provides the WLP0 node a small gate length, such that the gate-induced leakage is minimized; the larger width dimension 334B provides the WLR0 node a greater gate length, such that the risk of punch through is mitigated.

Figure 12:
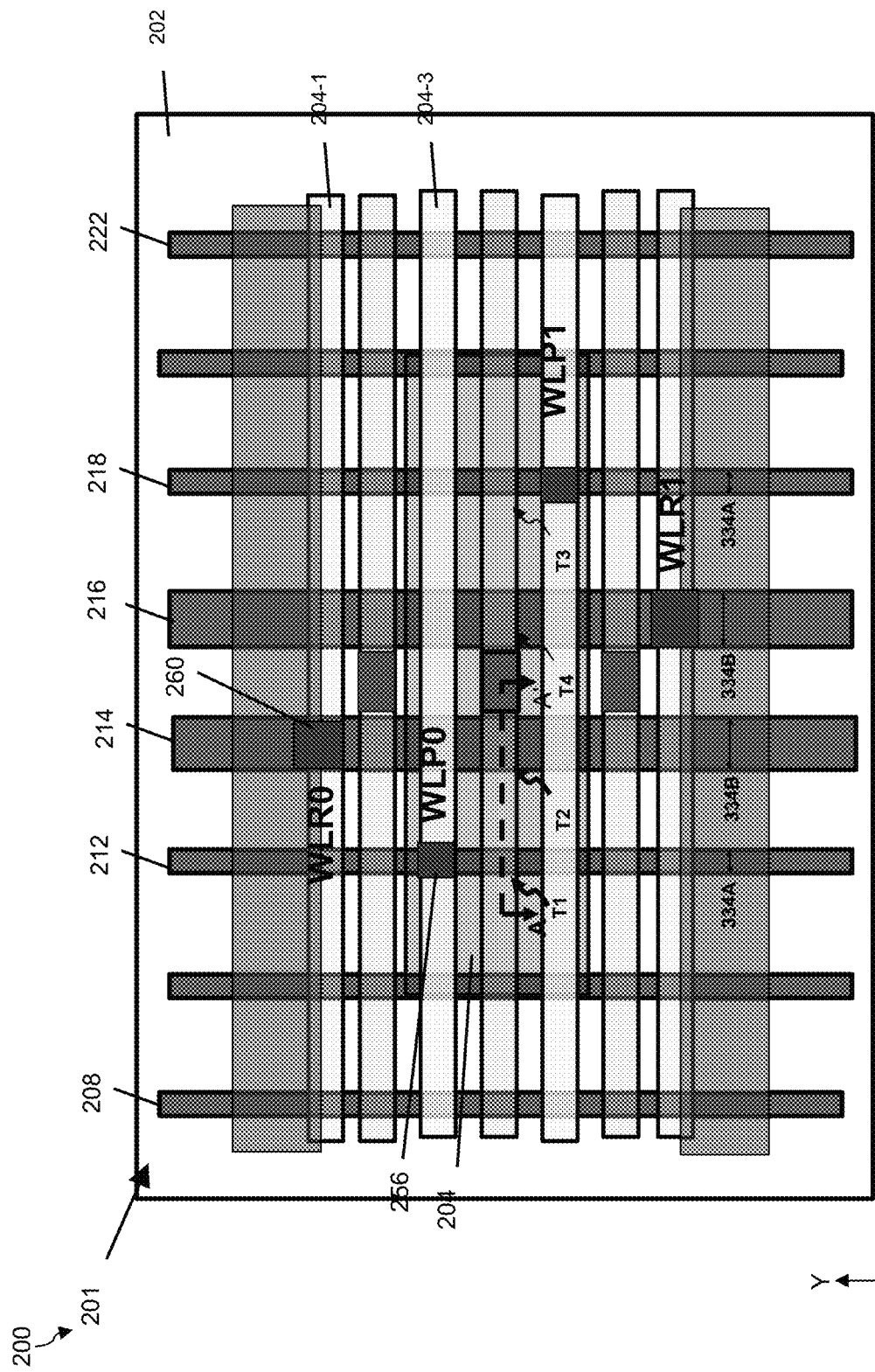
FIG. 12 is a layout view of a portion of the semiconductor memory structure in accordance with some embodiments of the present disclosure.

FIG. 12 is a layout view of the portion 201 of the semiconductor memory structure 200. Referring to blocks 30 and 32 of FIG. 2A and to FIG. 12, via feature 256 is formed on the gate structure 212; and via feature 260 is formed on the gate structure 214. In some embodiments, the via feature 256 has a dimension along the X-direction that approximately matches the width dimension 334A of the gate structure 212; and/or the via feature 260 has a dimension along the X-direction that approximately matches the width dimension 334B of the gate structure 214. In some embodiments, the interfacial resistance between two conductive features is determined by the surface area of the interface. Having matched dimensions between the via features and the gate structures allows the interfacial resistances to be minimized. Accordingly, the via features 256 and 260 each have a size that roughly scales with the width dimensions of the gate structures on which they overlay, such that the size of via feature 256 (represented by, for example, the surface area of an XY cross-section of the via feature 256) is less than the size of via feature 260. For example, a ratio of the size for the via feature 256 to the size for the via feature 260 may be about 1:1 to about 1:4. If the ratio is too small or too large, the interfacial resistances may not be minimized. Furthermore, metal line 204-3 is formed on the via feature 256; and metal line 204-1 is formed on the via feature 260. Accordingly, WLP0 node is formed from the gate structure 212 and the overlaying metal line 204-3; and WLR0 node is formed from the gate structure 214 and the overlaying metal line 204-1. As illustrated in FIG. 12, additional WLP nodes and additional WLR nodes may be further formed from gate structures (such as gate structures 218 and 216, respectively) that incorporate features described above. Bit lines similar to the metal lines 104-2, 104-4, and/or 104-6 are further formed to connect to the active regions 204. Additionally, referring to block 34 of FIG. 2A, various other features are formed to complete the fabrication of the semiconductor memory device 200.

The various embodiments described herein offer several advantages over the existing art. It will be understood that not all advantages have been necessarily discussed herein, no particular advantage is required for all embodiments, and other embodiments may offer different advantages. For example, embodiments discussed herein include a semiconductor memory structure having a design that provides a program word line (WLP) with a width 334A, a read word line (WLR) with a width 334B, where the width 334A is less than the width 334B. In other words, the gate length for the WLP is less than the gate length for the WLR. As a result of the disclosed semiconductor memory structure design, the gate leakage current (Igi) is reduced by a factor of three (3), and the read margin is improved by a factor of 3.3. In some embodiments, the semiconductor memory structure disclosed herein includes an OTP NVM device. However, in some cases, the semiconductor memory structure may in some cases include other types of NVM devices. Additional details of embodiments of the present disclosure are provided below, and additional benefits and/or other advantages will become apparent to those skilled in the art having benefit of the present disclosure.

In one general aspect, the present disclosure is directed to a semiconductor device. The semiconductor device includes a program word line and a read word line over an active region. Each of the program word line and the read word line extends along a line direction. Moreover, the program word line engages a first transistor channel and the read word line engages a second transistor channel. The semiconductor device also includes a first metal line over and electrically connected to the program word line and a second metal line over and electrically connected to the read word line. The semiconductor device further includes a bit line over and electrically connected to the active region. Additionally, the program word line has a first width along a channel direction perpendicular to the line direction; the read word line has a second width along the channel direction; and the first width is less than the second width.

In some embodiments, a difference between the first width and the second width is about 0.5 nm to about 3 nm. In some embodiments, the first metal line is electrically connected to the program word line using a first conductive via, and the second metal line is electrically connected to the read word line using a second conductive via. The first conductive via has a first area at an interface between the first metal line and the program word line; and the second conductive via has a second area at an interface between the second metal line and the read word line. Moreover, a ratio of the first area to the second area is about 1:1 to about 1:4. In some embodiments, the semiconductor device further includes a first source/drain feature connected to the first transistor channel and the second transistor channel. Additionally, the first source/drain feature includes an n-type dopant. In some embodiments, the first metal line, the second metal lines and the bit line are within a same interconnect layer. In some embodiments, the semiconductor device further includes a first gate spacer of a spacer material on both sides of the program word line, and a second gate spacer of the spacer material on both sides of the read word line. The first gate spacer has a third width along the channel direction; the second gate spacer has a fourth width along the channel direction; and the third width is greater than the fourth width. In some embodiments, the semiconductor device also includes a third gate spacer of a first dielectric material on both sides of the program word line; a fourth gate spacer of the first dielectric material on both sides of the read word line; and a fifth gate spacer of a second dielectric material interposing between the first gate spacer and a sidewall surface of the program word line. Moreover, the second gate spacer directly contacts a sidewall surface of the read word line. In some embodiments, the first width is about 5 nm to about 30 nm.

In one general aspect, the present disclosure is directed to a device. The device includes a substrate, a first gate structure and a second gate structure over an active region of the substrate. The first and the second gate structures extend in parallel and adjacent to each other. The first gate structure engages a first channel between a first source/drain feature and a second source/drain feature on the substrate, and the second gate structure engages a second channel between the second source/drain feature and a third source/drain feature. Moreover, the device also includes a bit line electrically connected to the third source/drain feature. The first gate structure has a first gate length along a first direction between the first source/drain feature and the second source/drain feature. The second gate structure has a second gate length along the first direction. Furthermore, the first gate length is less than the second gate length.

In some embodiments, a difference between the first gate length and the second gate length is about 0.5 nm to about 3 nm. In some embodiments, the device further includes a first metal line and a second metal line. The first metal line extends perpendicular to the first and the second gate structures and electrically connected to the first gate structure through a first conductive via; and the second metal line extends perpendicular to the first and the second gate structures and electrically connected to the second gate structure through a second conductive via. Moreover, the first conductive via has a first cross-section area on a plane parallel to a top surface of the substrate, the second conductive via has a second cross-section area on the plane, and a ratio of the first area to the second area is about 1:1 to about 1:4. In some embodiments, the device further includes a first gate spacer on a sidewall surface of the first gate structure, and a second gate spacer on a sidewall surface of the second gate structure. The first gate spacer has a first spacer thickness, the second gate spacer has a second spacer thickness, and a difference between the first spacer thickness and the second spacer thickness is about 0.25 nm to about 1.5 nm.

One general aspect of the present disclosure is directed to a method. A workpiece is received. The workpiece includes a first gate structure interposing between a first source/drain feature and a second source/drain feature, a second gate structure interposing between the second source/drain feature and a third source/drain feature. The first gate structure includes a first dummy gate and a first gate spacer on sidewall surfaces of the first dummy gate, and the second gate structure includes a second dummy gate and a second gate spacer on sidewall surfaces of the second dummy gate. The first and the second dummy gates are removed to form a first gate trench and a second gate trench, respectively. The first gate spacer is recessed by a first amount along a first direction and the second gate spacer is recessed by a second amount along the first direction. The first amount is less than the second amount. A gate dielectric layer is formed in the first gate trench and in the second gate trench. A first gate electrode is formed in the first gate trench. And a second gate electrode is formed in the second gate trench.

In some embodiments, a first metal line is formed which is electrically connected to the first gate structure. A second metal line is formed which is electrically connected to the second gate structure. A bit line is formed which is electrically connected to the third source/drain feature. In some embodiments, the recessing includes first forming a mask element over the first gate structure; then recessing the second gate spacer by a third amount along the first direction; then removing the mask element; and subsequently recessing the first gate spacer and the second gate spacer each by the first amount. Moreover, a sum of the first amount and the third amount equals the second amount. In some embodiments, a ratio of the third amount to the first amount is about 2:1 to about 4:1. In some embodiments, the recessing includes adjusting a number of etching cycles and a time duration for each of the etching cycles to tune the first amount and the second amount. In some embodiments, the method further includes forming a mask element over the substrate. The mask element has a first opening of a first dimension along the first direction over the first gate structure and a second opening of a second dimension along the first direction over the second gate structure. Moreover, the recessing includes recessing through the first and the second openings of the mask element. The first dimension is less than the second dimension, the first dimension determines the first amount, and the second dimension determines the second amount. In some embodiments, a difference between the first dimension and the second dimension is about 0.5 nm to about 30 nm. In some embodiments, the method further includes forming a first metal line electrically connected to the first gate structure, a second metal line electrically connected to the second gate structure; and forming a third metal line electrically connected to the third source/drain feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
receiving a workpiece including:
a first dummy gate,
a second dummy gate adjacent the first dummy gate, a first gate spacer disposed along sidewalls of the first dummy gate, and
a second gate spacer disposed along sidewalls of the second dummy gate,
removing the first dummy gate and the second dummy gate to form a first gate trench and a second gate trench, respectively;
enlarging the first gate trench and the second gate trench, wherein the enlarged second gate trench is wider than the enlarged first gate trench;
forming a first metal gate structure in the enlarged first gate trench; and
forming a second metal gate structure in the enlarged second gate trench.

2. The method of claim 1, wherein the enlarging of the first gate trench and the second gate trench includes removing a first portion of the first gate spacer and a second portion of the second gate spacer, the second portion being greater than the first portion.

3. The method of claim 1, wherein the enlarging of the first gate trench and the second gate trench includes:
forming a mask element over the first gate trench and the first gate spacer,
recessing the second gate spacer by a first amount,
removing the mask element, and
recessing the first gate spacer and the second gate spacer each by a second amount.

4. The method of claim 1, wherein the enlarging of the first gate trench and the second gate trench includes:
forming a mask element over the workpiece, wherein the mask element exposes top surfaces of the first gate trench, the second gate trench, a first portion of the first gate spacer, and a second portion of the second gate spacer, and
recessing the first portion of the first gate spacer and the second portion of the second gate spacer.

5. The method of claim 1, wherein the workpiece further includes a third gate spacer disposed along sidewalls of the second gate spacer, and
wherein the enlarging of the first gate trench and the second gate trench includes recessing a portion of the first gate spacer and an entirety of the second gate spacer.

6. The method of claim 5, wherein the enlarging of the first gate trench and the second gate trench further includes:
forming a mask element over the workpiece, wherein the mask element exposes top surfaces of the portion of the first gate spacer, the second gate spacer, and a portion of the third gate spacer.

7. The method of claim 1, further comprising:
forming a first metal line electrically connected to the first metal gate structure; and
forming a second metal line electrically connected to the second metal gate structure.

8. A method, comprising:
receiving a workpiece including:
an active region disposed over a substrate,
a first dummy gate and a second dummy gate disposed over the active region,
a first gate spacer disposed on sidewall surfaces of the first dummy gate, and
a second gate spacer disposed on sidewall surfaces of the second dummy gate,
removing the first dummy gate to form a first gate trench;
removing the second dummy gate to form a second gate trench;
laterally recessing the first gate spacer from the first gate trench by a first distance;
laterally recessing the second gate spacer from the second gate trench by a second distance, the first distance being less than the second distance;
forming a first metal gate structure in the first gate trench; and
forming a second metal gate structure in the second gate trench.

9. The method of claim 8, further comprising:
forming a mask element over the workpiece, wherein the mask element has a first opening exposing a top surface of the first gate spacer and a second opening exposing a top surface of the second gate spacer, wherein the second opening is wider than the first opening.

10. The method of claim 9, wherein an edge of the first opening is directly above the first gate spacer, and an edge of the second opening is directly above the second gate spacer.

11. The method of claim 9, wherein the workpiece further includes a third gate spacer disposed on sidewalls of the second gate spacer and having a different material from the second gate spacer,
wherein an edge of the first opening is directly above the first gate spacer, and
wherein an edge of the second opening is directly above the third gate spacer.

12. The method of claim 8, wherein the active region includes a source/drain feature adjacent to the second dummy gate, and wherein the method further comprises:
forming a first metal line electrically connected to the first metal gate structure,
forming a second metal line electrically connected to the second metal gate structure, and
forming a bit line electrically connected to the source/drain feature.

13. A method, comprising:
receiving a workpiece including:
a first gate structure interposing between a first source/drain feature and a second source/drain feature,
a second gate structure interposing between the second source/drain feature and a third source/drain feature,
wherein the first gate structure includes a first dummy gate and a first gate spacer on sidewall surfaces of the first dummy gate, and the second gate structure includes a second dummy gate and a second gate spacer on sidewall surfaces of the second dummy gate,
removing the first and the second dummy gates to form a first gate trench and a second gate trench, respectively;
recessing the first gate spacer by a first amount along a first direction and the second gate spacer by a second amount along the first direction, the first amount being less than the second amount;
forming a gate dielectric layer in the first gate trench and in the second gate trench;
forming a first gate electrode in the first gate trench; and
forming a second gate electrode in the second gate trench.

14. The method of claim 13, further comprising:
forming a first metal line electrically connected to the first gate structure;
forming a second metal line electrically connected to the second gate structure; and
forming a bit line electrically connected to the third source/drain feature.

15. The method of claim 13, wherein the recessing includes:

forming a mask element over the first gate structure;
after forming the mask element, recessing the second gate spacer by a third amount along the first direction;
after recessing the second gate spacer by the third amount, removing the mask element; and
after removing the mask element, recessing the first gate spacer and the second gate spacer each by the first amount,
wherein a sum of the first amount and the third amount equals the second amount.

16. The method of claim 15, wherein a ratio of the third amount to the first amount is about 2:1 to about 4:1.

17. The method of claim 13, wherein the recessing includes adjusting a number of etching cycles and a time duration for each of the etching cycles to tune the first amount and the second amount.

18. The method of claim 13, further comprising forming a mask element over the workpiece, the mask element having a first opening of a first dimension along the first direction over the first gate structure and a second opening of a second dimension along the first direction over the second gate structure,
   wherein the recessing includes recessing through openings of the mask element,
   wherein the first dimension is less than the second dimension, and
   wherein the first dimension determines the first amount, and the second dimension determines the second amount.

19. The method of claim 18, wherein a difference between the first dimension and the second dimension is about 0.5 nm to about 30 nm.

20. The method of claim 13, further comprising:
   forming a first metal line electrically connected to the first gate structure, a second metal line electrically connected to the second gate structure; and
   forming a third metal line electrically connected to the third source/drain feature.

* * * * *